United States Patent
Schöll et al.

(10) Patent No.: US 11,111,385 B2
(45) Date of Patent: Sep. 7, 2021

(54) SILICONE COMPOSITION

(71) Applicant: OSRAM Opto Semiconductors GmbH, Regensburg (DE)

(72) Inventors: Hansjörg Schöll, Bad Abbach (DE); Stephan Blaszczak, Freyburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/323,412

(22) PCT Filed: Aug. 4, 2017

(86) PCT No.: PCT/EP2017/069817
§ 371 (c)(1),
(2) Date: Feb. 5, 2019

(87) PCT Pub. No.: WO2018/029107
PCT Pub. Date: Feb. 15, 2018

(65) Prior Publication Data
US 2019/0161614 A1    May 30, 2019

(30) Foreign Application Priority Data

Aug. 11, 2016 (DE) ..................... 10 2016 114 921.7

(51) Int. Cl.
*H01L 33/56* (2010.01)
*C08L 83/04* (2006.01)
*C08G 77/04* (2006.01)

(52) U.S. Cl.
CPC ............. *C08L 83/04* (2013.01); *H01L 33/56* (2013.01); *C08G 77/04* (2013.01); *C08L 2205/025* (2013.01)

(58) Field of Classification Search
CPC ........ C08G 77/12; C08G 77/20; C08G 77/80; C08K 5/5419; H01L 33/56
See application file for complete search history.

(56) References Cited

U.S. PATENT DOCUMENTS

| | | |
|---|---|---|
| 2009/0283779 A1 | 11/2009 | Negley et al. |
| 2010/0155758 A1 | 6/2010 | Kumei et al. |
| 2013/0181248 A1 | 7/2013 | Eberhardt et al. |
| 2013/0207148 A1 | 8/2013 | Kräuter et al. |
| 2014/0285088 A1 | 9/2014 | Windisch |
| 2014/0339473 A1* | 11/2014 | Onai ............... C09K 11/08 252/301.36 |
| 2015/0001567 A1 | 1/2015 | Amako et al. |
| 2015/0207047 A1 | 7/2015 | Amako et al. |
| 2016/0025906 A1* | 1/2016 | Liu .................. F21V 5/002 40/544 |
| 2016/0126221 A1 | 5/2016 | Windisch et al. |

FOREIGN PATENT DOCUMENTS

| | | |
|---|---|---|
| CN | 102081184 A | 6/2011 |
| CN | 104393155 A | 3/2015 |
| DE | 10 2010 034 913 A1 | 2/2012 |
| DE | 10 2011 111 917 A1 | 2/2013 |
| DE | 10 2012 219 460 A1 | 4/2014 |
| DE | 10 2011 085 645 B4 | 6/2014 |
| JP | 2009-267289 A | 11/2009 |
| JP | 2011-523511 A | 8/2011 |
| JP | 2011-184625 A | 9/2011 |
| JP | 2013-539223 A | 10/2013 |
| JP | 2013-236081 | 11/2013 |
| JP | 2014-221880 A | 11/2014 |

OTHER PUBLICATIONS

"Polymer blend," *Wikipedia, The Free Encyclopedia*, Apr. 11, 2018, https://en.wikipedia.org/wiki/Polymer_blend.
Notice of Reasons for Rejection dated Feb. 25, 2020, of counterpart Japanese Application No. 2019-503542, along with an English translation.
The First Office Action dated Oct. 13, 2020, of counterpart Chinese Application No. 201780049264.8, along with an English translation.
Notice of Reasons for Rejection dated Dec. 1, 2020, of counterpart Japanese Application No. 2019-503542, along with an English translation.
"Dow Coming's new LED sealand provides high light transmittance", retrieved from the internet at http://www.gg-led.com/asd1sp2-65b0951b5077— html, Alladin Lighting Network, Oct. 22, 2007, along with a machine English translation.
"Modified silicone oil", retrieved from the internet at www.dgjamon.com/Brand/info_132_itemid_1677.html, JYD International, Shin-Etsu, along with a machine English translation.
The Third Office Action dated May 25, 2021, of counterpart Chinese Application No. 201780049264.8, along with an English translation.
Decision of Rejection including Decision for Dismissal of Amendment dated Jul. 6, 2021, of counterpart Japanese Application No. 2019-503542, with English translations.

* cited by examiner

*Primary Examiner* — Kuo Liang Peng
(74) *Attorney, Agent, or Firm* — DLA Piper LLP (US)

(57) ABSTRACT

A silicone composition includes a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, and the high-refractive silicone forms inclusions within the low-refractive silicone.

10 Claims, 12 Drawing Sheets

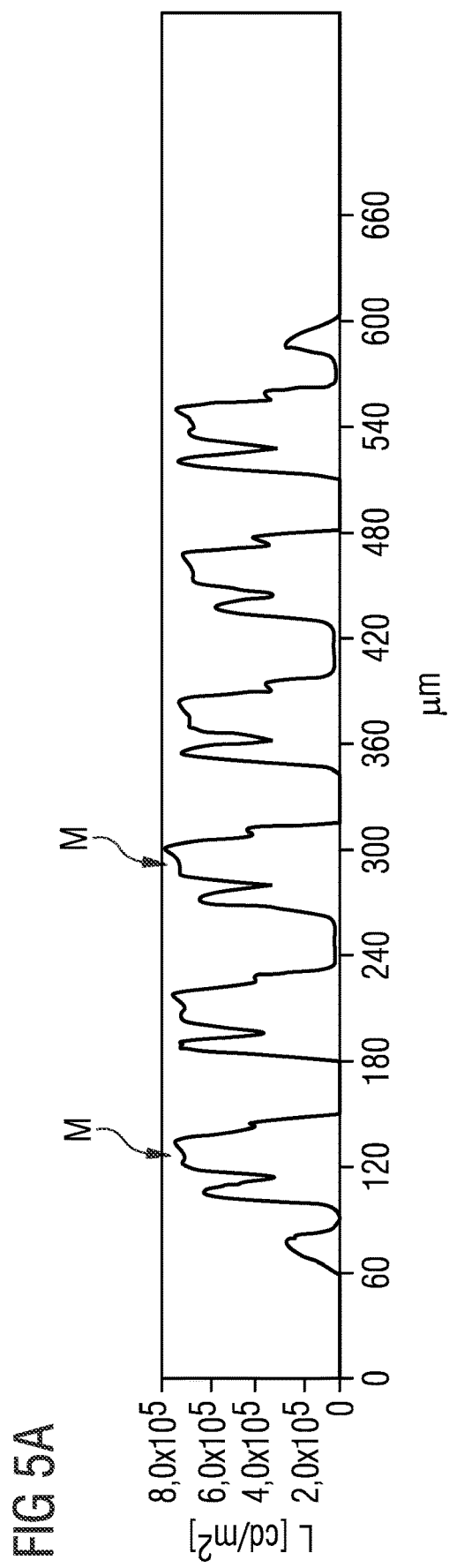

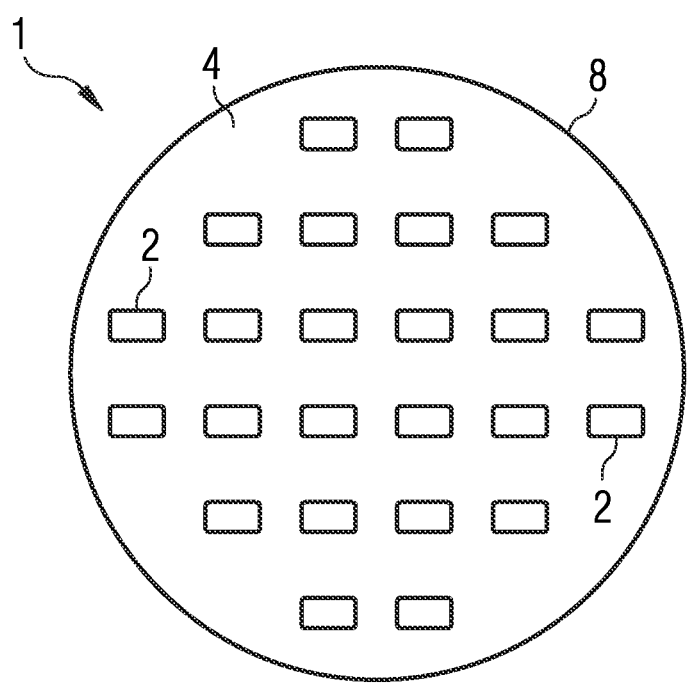

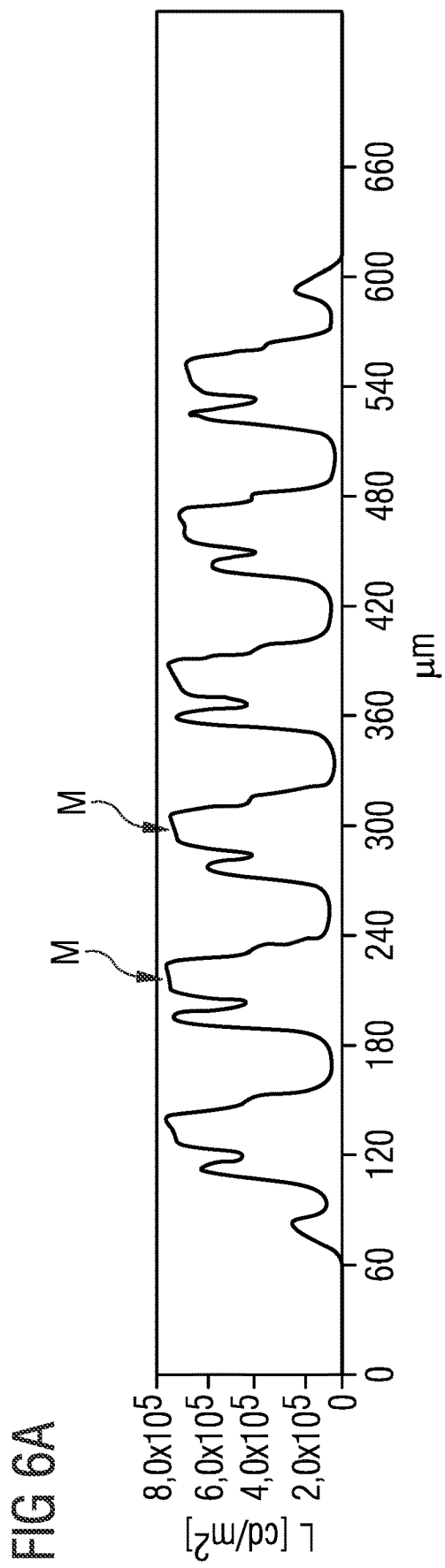

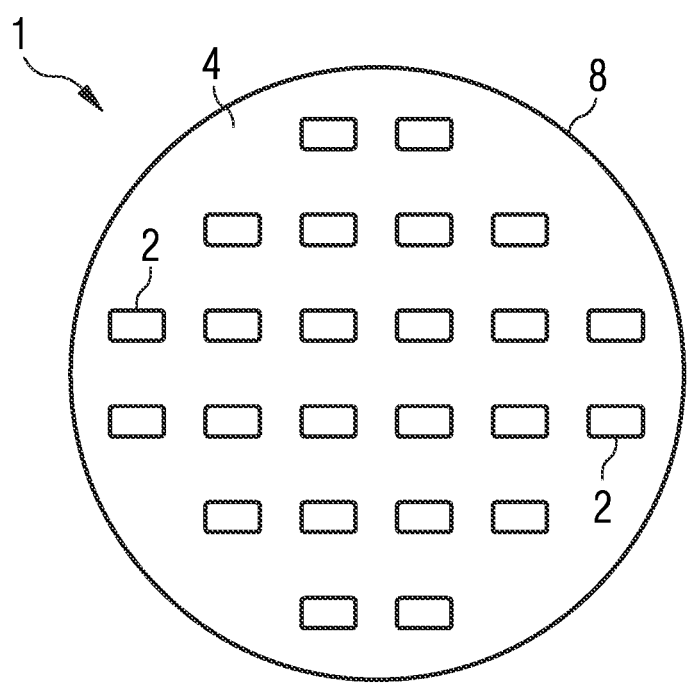

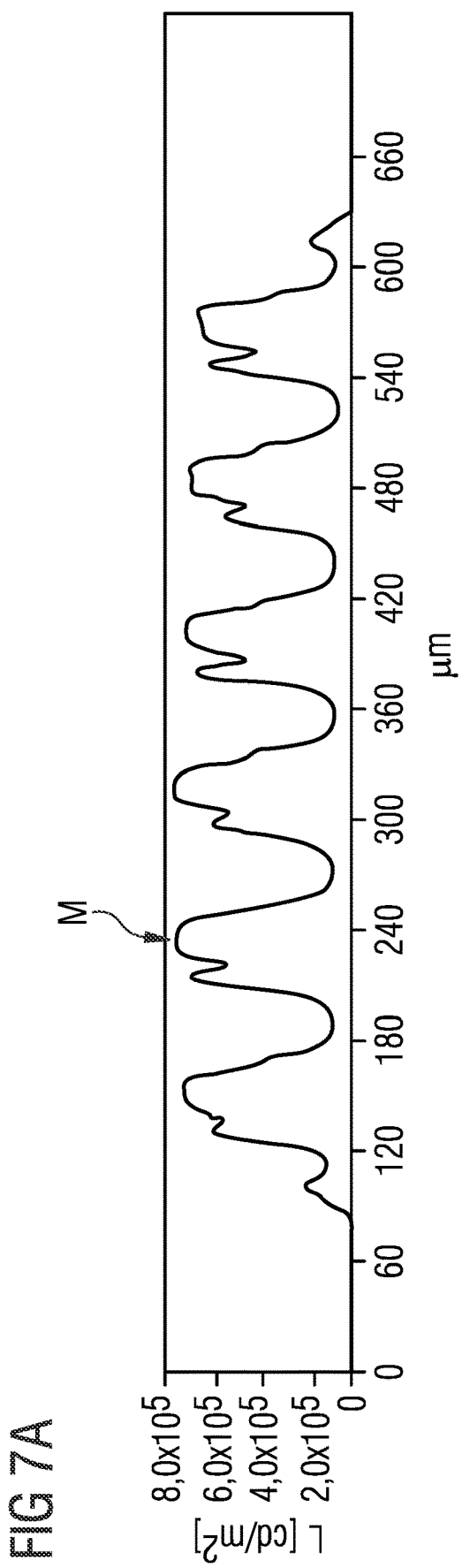

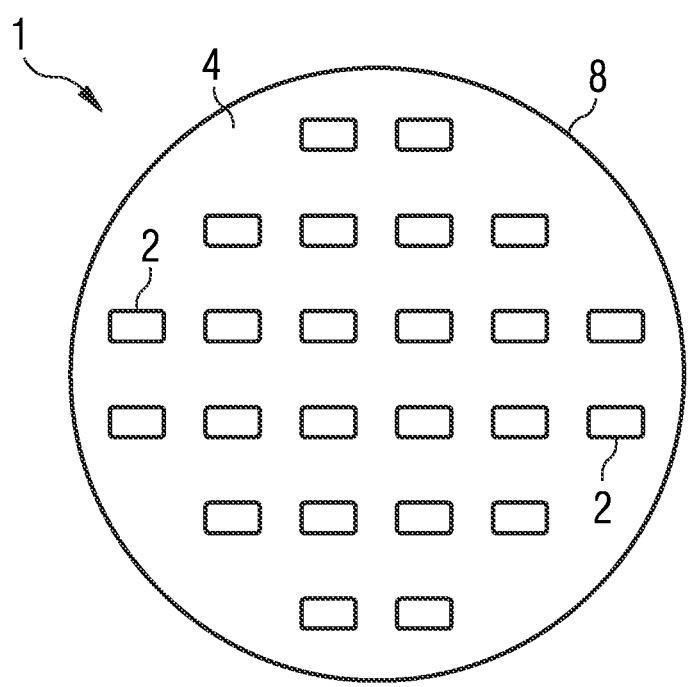

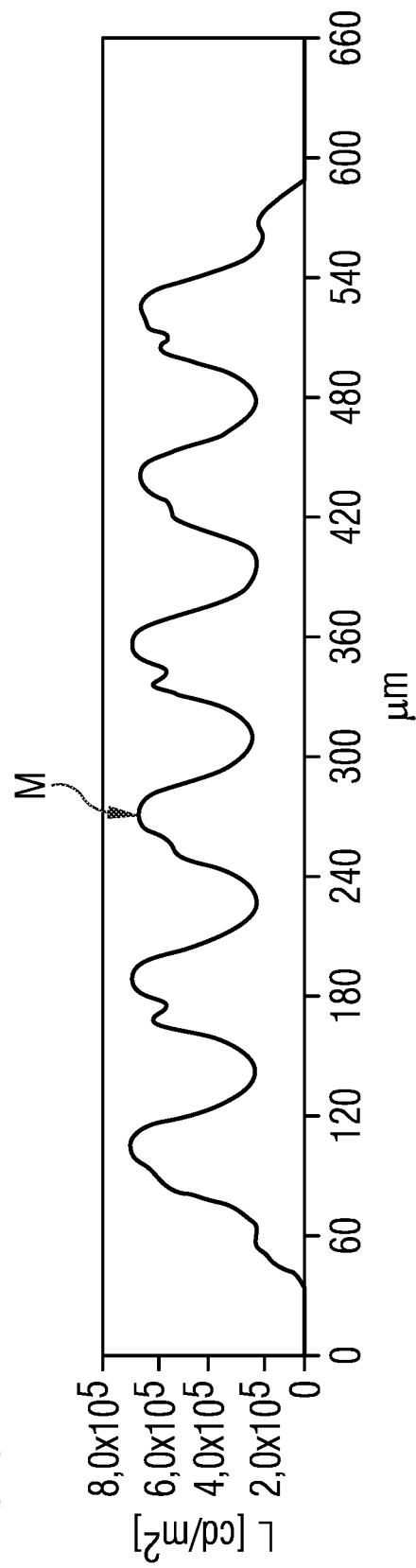

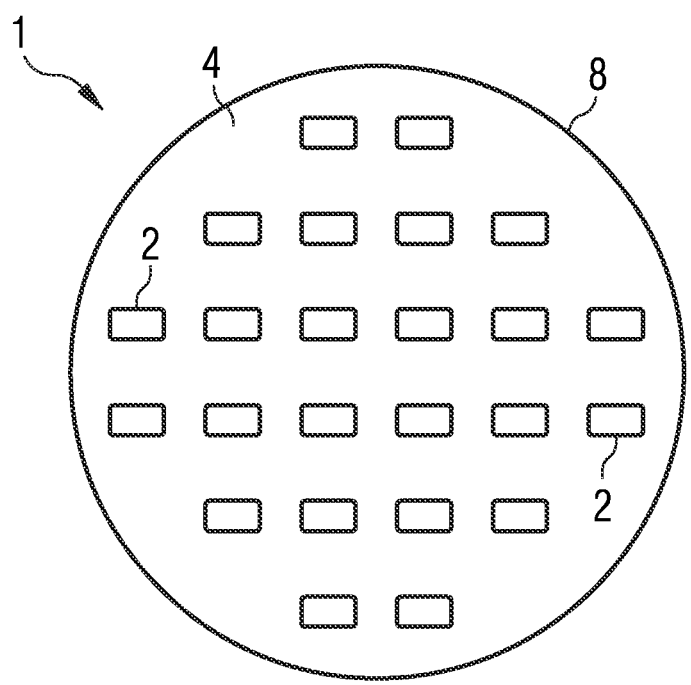

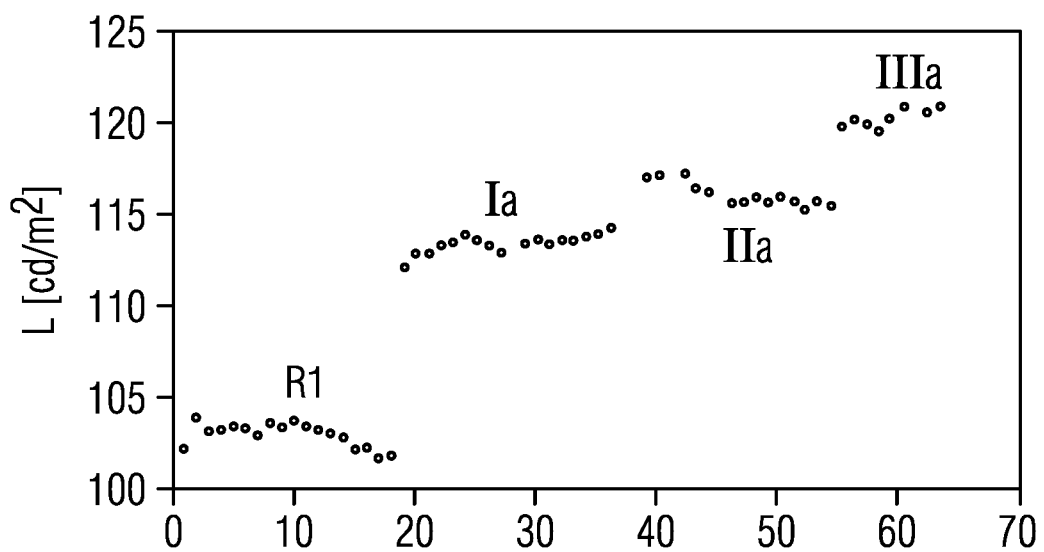
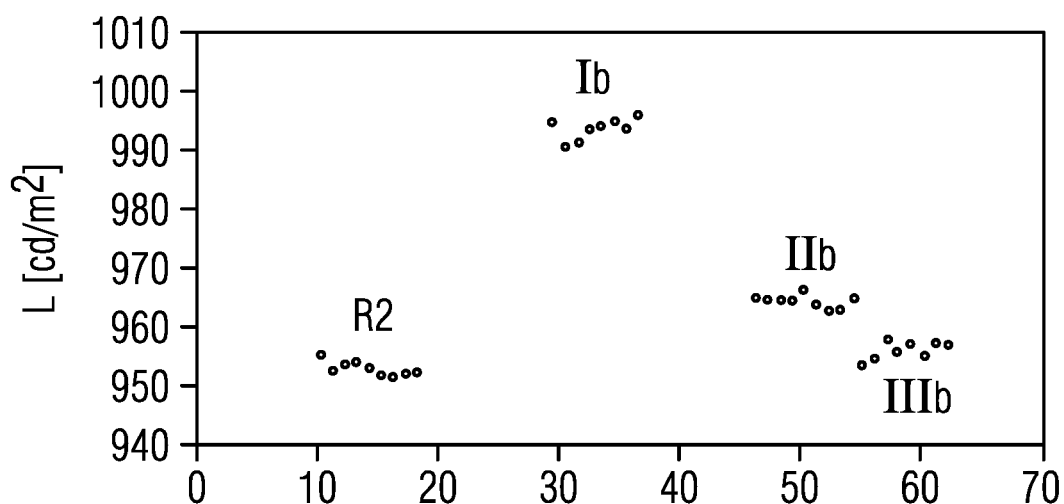

SILICONE COMPOSITION

TECHNICAL FIELD

This disclosure relates to a silicone composition, use of a silicone composition, a method of producing a silicone composition and a light-emitting device comprising a silicone composition.

BACKGROUND

High-reflective and/or light-scattering layers are required to couple out as much of the light produced by a light-emitting device to the outside environment as possible. Solid particles with a higher refractive index than the potting material are usually added to a silicone potting for light scattering and thus increased light extraction. Alternatively, externally used optics such as diffusing lenses can be mounted in the beam path of the light source to scatter the light. The white pigment titanium dioxide is often used for reflective layers in high-concentration (>25%). Titanium dioxide, for example, has a high-refractive index and is therefore capable of both efficiently scattering and reflecting the incident light. However, this requires a very precise adherence to the particle content. To increase the homogeneity of the light to be coupled out, for example, solid particles are mixed into the potting in a light-emitting device having one or more semiconductor chips. Multiple reflection also prevents the imaging of the individual semiconductor chips on the surface to be illuminated. A disadvantage of the use of solid particles for light scattering is that light losses are due to absorption of the light and therefore light scattering takes place, but the light-emitting device shows efficiency losses.

It could therefore be helpful to provide a silicone composition capable of scattering and/or reflecting light and at the same time does not absorb the light or hardly absorbs it at all, provide the use and a method of producing a silicone composition and provide a light-emitting device in which light is efficiently scattered and/or reflected and that has very high efficiency.

SUMMARY

We provide a silicone composition including a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, and the high-refractive silicone forms inclusions within the low-refractive silicone.

We also provide a scattering body including the silicone composition including a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, and the high-refractive silicone forms inclusions within the low-refractive silicone that scatters and/or reflects light.

We further provide a method of producing the silicone composition including a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, and the high-refractive silicone forms inclusions within the low-refractive silicone including:

A) mixing a precursor of a low-refractive silicone with a first curing agent,
B) mixing a precursor of a high-refractive silicone with a second curing agent,
C) mixing the mixtures produced in method steps A) and B) to form an emulsion, and
D) curing the emulsion formed in method step C) to form the silicone composition.

We yet further provide a light-emitting device including a scattering body including the silicone composition including a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, and the high-refractive silicone forms inclusions within the low-refractive silicone or consisting of the silicone composition.

We still further provide a light-emitting diode including a scattering body including the silicone composition including a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, and the high-refractive silicone forms inclusions within the low-refractive silicone or consisting of the silicone composition.

BRIEF DESCRIPTION OF THE DRAWINGS

FIGS. 5B, 6B, 7B and 8B show top views of light-emitting diodes.

FIGS. 5A, 6A, 7A, 8A, 9 and 10 show luminances of different light-emitting diodes.

Figure 1:
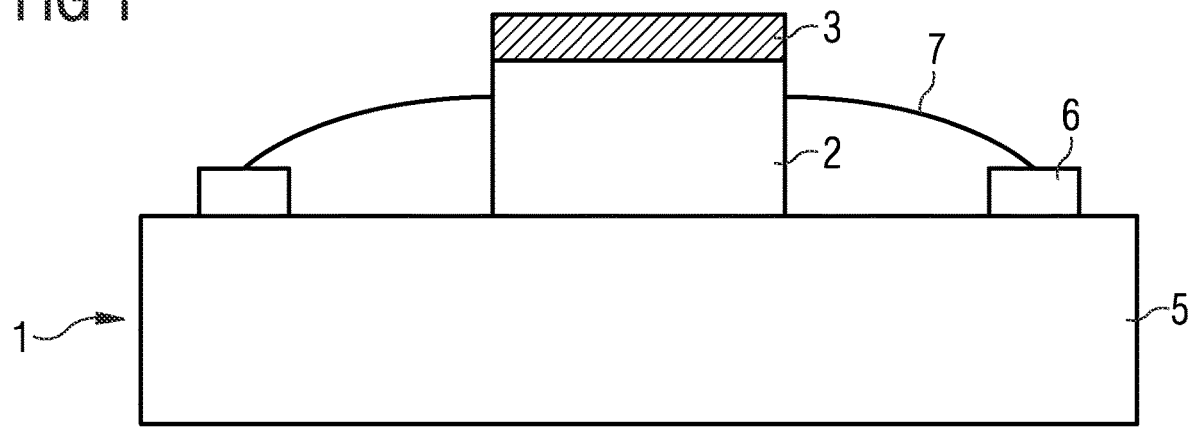
FIGS. 1 to 4 and 11 show schematic side views of various examples of light-emitting diodes.

REFERENCE SIGNS 1 light-emitting diode
2 layer sequence, semiconductor chip
2a main surface of the layer sequence
3 scattering body
4 potting
5 carrier
6 lead frame
7 bonding wires
8 housing
L luminance
$n^{25}_{D589}$ refractive index measured at 25° C. and a wavelength of λ=589 nm
λ wavelength
cd Candela
mm² square millimeter
nm nanometer
μm micrometer
R1, Ia, IIa, IIIa,
R2, Ib, IIb, IIIb luminances

DETAILED DESCRIPTION

Our silicone composition comprises a mixture of a low-refractive silicone having a refractive index $n^{25}_{D589}$ less than 1.45 and a high-refractive silicone having a refractive index $n^{25}_{D589}$ greater than 1.50. The refractive index $n^{25}_{D589}$ is measured at 25° C. and a wavelength of $\lambda=589$ nm.

The silicone composition may comprise a multiphase mixture of a low-refractive silicone having a refractive index $n^{25}_{D589}$ of less than 1.45 and a high-refractive silicone having a refractive index $n^{25}_{D589}$ of greater than 1.50. That it is a multiphase mixture of a low-refractive silicone and a high-refractive silicone means in particular that the low-refractive silicone forms one phase and the high-refractive silicone forms another phase within the silicone composition. In other words, the low-refractive silicone and the high-refractive silicone are not mixable. The silicone composition can thus also be described as a polymer blend or as a silicone blend, in particular as a heterogeneous polymer or silicone blend.

Because the silicone composition is a multiphase mixture of a low-refractive silicone and a high-refractive silicone, the silicone composition has several, in particular two, glass temperatures.

The silicone composition may comprise a mixture of a low-refractive silicone having a refractive index $n^{25}_{D589}$ of 1.35 to 1.45 and a high-refractive silicone having a refractive index $n^{25}_{D589}$ of 1.50 to 1.60. Preferably, the low-refractive silicone has a refractive index $n^{25}_{D589}$ of 1.38 to 1.43 and the high-refractive silicone has a refractive index $n^{25}_{D589}$ of 1.50 to 1.55. For example, the low-refractive silicone has a refractive index $n^{25}_{D589}$ of 1.40 or 1.41 or 1.42 and the high-refractive silicone has a refractive index $n^{25}_{D589}$ of 1.51 or 1.52.

The proportion of high-refractive silicone may be 0.1 to 5.0 mass percent, preferably 0.4 to 3.0 mass percent, particularly preferably 0.5 to 2.0 mass percent, in relation to the total mass of high-refractive and low-refractive silicone. The low-refractive silicone may be present in excess compared to the high-refractive silicone. These mass fractions of high-and low-refractive silicone have proven to be particularly efficient in terms of light scattering.

The high-refractive silicone may be homogeneous or at least largely homogeneously distributed in the low-refractive silicone. In other words, the high-refractive silicone forms droplet structures, also known as inclusions, within the low-refractive silicone. Incident light can be efficiently scattered and/or reflected on these droplet structures as the high-refractive index of the silicone is higher than the low-refractive index of the silicone. The droplet structures or inclusions of high-refractive silicone thus form scattering centers within the silicone composition. Surprisingly, incident light, in particular visible light, can be scattered and/or reflected with this silicone composition, but shows little or no absorption of the incident light. Therefore, the silicone composition is particularly suitable for the use in a scattering body of a light-emitting device. We found that, when the composition is used in a scattering body of a light-emitting device, despite the desired scattering effect, an increase in the efficiency of the coupled-out light can surprisingly be observed. In addition, an improved homogeneity of the scattering effect is obtained compared to conventional arrangements in which scattering particles are used.

The silicone composition may contain no scattering particles. In other words, the silicone composition is free of particles where light can be scattered and/or reflected. Scattering particles are not necessary, since light scattering and/or light reflection takes place in particular at the inclusions made of high-refractive silicone.

The high-refractive silicone inclusions may have a diameter of 1 μm to 15 μm, preferably 2 μm to 10 μm, preferably 2 μm to 6 μm. Thus, the inclusions from the high-refractive silicone are detectable during an examination of the silicone composition. The diameters can be determined using a microscope, for example. In particular, with such diameters, incident light can be scattered and/or reflected particularly well.

The silicone composition may be diffuse or milky translucent.

The use of a silicone composition is provided. All features of the silicone composition are also disclosed for their use and vice versa.

The use of a silicone composition for scattering and/or reflecting light, in particular visible light, is provided. The silicone composition comprises a multiphase mixture of a low-refractive silicone having a refractive index $n^{25}_{D589}$ of less than 1.45 and a high-refractive silicone having a refractive index $n^{25}_{D589}$ of greater than 1.50.

The use of the silicone composition in a scattering body for scattering and/or reflecting light is provided. The scattering body may be part of a light-emitting device.

The light-emitting device may be a light-emitting diode, a lamp or a luminaire according to at least one example. For example, a lamp or luminaire is a halogen or fluorescent lamp. For example, the scattering body can be applied as a diffusing screen in front of a lamp or directly in the form of a layer on a glass body of a lamp.

The silicone composition may be arranged on a light-emitting surface of the light-emitting device. Thus, the light produced in the light-emitting device passes through the silicone composition before it is coupled out to the environment and is scattered and/or reflected before it is coupled out.

We also provide a method of producing a silicone composition. All features of the silicone composition are also disclosed for its method and vice versa.

In our method of preparing a silicone composition, the silicone composition comprises a mixture of a low-refractive silicone having a refractive index $n^{25}_{D589}$ less than 1.45 and a high-refractive silicone having a refractive index $n^{25}_{D589}$ greater than 1.50. The method comprises the following steps:

A) mixing a precursor of a low-refractive silicone with a first curing agent. The low-refractive silicone has a refractive index $n^{25}_{D589}$ less than 1.45, B) mixing a precursor of a high-refractive silicone with a second curing agent. The refractive index $n^{25}_{D589}$ of the high-refractive silicone is greater than 1.50, C) mixing the mixtures produced in method steps A) and B) to form an emulsion, D) curing the emulsion formed in method step C) to form the silicone composition.

In particular, method steps A) to D) are carried out in the order indicated.

Method step C) may take place very soon after completion of method steps A) and B) to prevent (complete) curing or (complete) formation of the low-refractive silicone and (complete) curing or (complete) formation of the high-refractive silicone. Preferably, formation of the silicones has not yet begun during method step C).

The progress of curing or formation of the silicones can be determined by viscosity measurements. In particular, the viscosity of the mixture of the precursor of the low-refractive silicone with the first curing agent and the viscosity of the mixture of the precursor of the high-refractive silicone with the second curing agent should not exceed the initial value of the viscosity immediately after the mixing of the corresponding precursor with the corresponding curing agent in method steps A) and B), respectively, of 20 percent, preferably of 10 percent, when method step C) is carried out.

The mixture from method step B) may form droplets within the emulsion formed in method step C), i.e., the inner phase within the emulsion, wherein the mixture prepared from method step A) forms the outer phase or the continuous phase of the emulsion. After curing of the emulsion formed in method step D), the silicone composition is formed, in which the high-refractive silicone is homogeneously distributed in the low-refractive silicone and thus a multiphase mixture of the low-refractive silicone and the high-refractive silicone. Thus, both the mixtures from method steps A) and B) cannot be mixed with each other, so that an emulsion is formed in method step C), as well as the formed low-refractive and high-refractive silicone, so that a heterogeneous polymer blend or silicone blend is formed in method step D).

This example comprises a method step E): E) applying the mixture formed in method step C) to a substrate by dispensing, for example, with a dispensing machine. This method step can take place between method steps C) and D). The absence or presence of only a small proportion of crystalline solid particles such as converter particles or reflector particles improves the flow-properties of the mixture to an advantage. In particular, the mixture formed in method step C) is liquid when applied in method step E). The application in method step E) thus takes place in particular promptly after method step C) to maintain the liquid state of the mixture during application. A complete curing or formation of the corresponding silicone from the time of mixing together the precursor and the curing agent in method steps A) and B) takes place, for example, after approximately eight hours. This leaves a processing time of approximately 8 hours, during which method steps A), B), C) and E) must be completed to ensure proper processing.

The precursor of the low-refractive silicone as well as the first curing agent and also the precursor of the high-refractive silicone and the second curing agent are commercially available under the names KJR90xx and LPS55xx, respectively, from ShinEtsu Chemical.

In particular, the first and second curing agents may be different curing agents.

The low- and high-refractive silicones may be platinum-catalyzed addition-crosslinked silicones. In method step D) platinum-catalyzed addition reactions take place that lead to formation of the corresponding silicone.

We also provide a light-emitting device. The light-emitting device comprises a scattering body having a silicone composition comprising a mixture, in particular a multiphase mixture of a low-refractive silicone having a refractive index $n^{25}_{D589}$ of less than 1.45 and a high-refractive silicone having a refractive index $n^{25}_{D589}$ of greater than 1.50.

All features of the silicone composition are also disclosed for the silicone composition of the scattering body of the light-emitting device and vice versa.

The light-emitting device can be a luminaire, a lamp or a light-emitting diode, for example. For example, a lamp or luminaire is a halogen or fluorescent lamp.

If electromagnetic radiation, in particular in the visible range of the electromagnetic spectrum, or light impinges on the scattering body, the radiation is refracted and/or totally reflected at the inclusions made of high-refractive silicone and thus scattered. Surprisingly, the radiation is not or hardly absorbed by the silicone composition. Surprisingly, absorption losses can thus be avoided or largely avoided. Usually the absorption of the radiation is an unavoidable and of course undesirable side effect in scattering particles such as $TiO_2$ particles since as a result the radiation emitted from the device to the outside has a lower luminous intensity and the device is therefore less efficient. Surprisingly, our silicone composition not only prevents losses in efficiency, but also increases efficiency of the device. In particular, the silicone composition makes it possible to achieve scattering and/or reflection of the radiation even without the addition of crystalline solids. The usually used crystalline solid particles usually have outer protective layers. If these protective layers are damaged, photochemical reactions occur, which cause discoloration and have a negative effect on the transparency or reduce the luminous flux. Since addition of crystalline solid particles is no longer necessary to achieve scattering and/or reflection due to the silicone composition, the absorption, which is usually caused by these particles, is also prevented.

The silicone composition may contain no scattering particles. In other words, the silicone composition may be free of particles where light can be scattered and/or reflected.

The scattering body may consist of the silicone composition.

The scattering body may be arranged on a light-emitting surface of the light-emitting device. The light emitted by the light-emitting device is emitted to the outside via the light-emitting surface. The produced light can thus be effectively scattered and/or reflected before emerging to the environment. This increases the luminous efficacy and ensures the homogeneity of the radiated light.

The light-emitting device may be a light-emitting diode. The light-emitting diode comprises at least one layer sequence with an active layer that emits electromagnetic primary radiation during operation of the device. The scattering body is arranged in particular in the beam path of the electromagnetic primary radiation.

In this context, "layer sequence" means a layer sequence comprising more than one layer, for example, a sequence of a p-doped and an n-doped semiconductor layer, wherein the layers are arranged one above the other and wherein at least one active layer emitting electromagnetic primary radiation is contained.

The layer sequence can be formed as an epitaxial layer sequence or as a radiation-emitting semiconductor chip with an epitaxial layer sequence, i.e., as an epitaxially grown semiconductor layer sequence. The layer sequence can be formed on the basis of InGaAlN, for example. InGaAlN-based semiconductor chips and semiconductor layer sequences are in particular those, in which the epitaxially produced semiconductor layer sequence has a layer sequence of different individual layers containing at least one individual layer having a material from the III-V compound semiconductor material system $In_xAl_yGa_{1-x-y}N$ with $0 \leq x \leq 1$, $0 \leq y \leq 1$ and $x+y \leq 1$. Semiconductor layer sequences that have at least one active layer based on InGaAlN can, for example, emit electromagnetic radiation in an ultraviolet to green wavelength range.

Alternatively or additionally, the semiconductor layer sequence or the semiconductor chip can also be based on InGaAlP, i.e., the semiconductor layer sequence can have different individual layers, of which at least one individual layer comprises a material from the III-V compound semiconductor material system $In_xAl_yGa_{1-x-y}P$ with $0 \leq x \leq 1$, $0 \leq y \leq 1$ and $x+y \leq 1$. Semiconductor layer sequences or semiconductor chips that have at least one active layer based on InGaAlP can, for example, preferably emit electromagnetic radiation with one or more spectral components in a green to red wavelength range.

Alternatively or additionally, the semiconductor layer sequence or the semiconductor chip may also contain other III-V compound semiconductor material systems such as an AlGaAs based material, or II-VI compound semiconductor material systems. In particular, an active layer comprising an AlGaAs-based material may be capable of emitting electromagnetic radiation having one or more spectral components in a red to infrared wavelength range.

In addition to the active layer, the active semiconductor layer sequence can include other functional layers and functional areas such as p- or n-doped charge carrier transport layers, i.e., electron or hole transport layers, undoped or p- or n-doped confinement, cladding or waveguide layers, barrier layers, planarization layers, buffer layers, protective layers and/or electrodes as well as combinations thereof. Furthermore, one or more mirror layers can be deposited on a side of the semiconductor layer sequence facing away from the growth substrate. The structures described here, the active layer or the other functional layers and regions are known in particular with regard to composition, function and structure and are therefore not explained in detail here.

The layer sequence can be a volume-emitting semiconductor chip, i.e., the radiation is radiated over all surfaces of the semiconductor chip.

The light-emitting diode may comprise at least one layer sequence emitting a primary electromagnetic radiation in the blue region of the electromagnetic spectrum. In particular, with primary radiation in the blue region of the electromagnetic spectrum, the scattering body comprising the silicone composition has proved to be advantageous, as the light is scattered on the one hand and a surprising increase in efficiency of the diode is observed on the other hand. Depending on the structure of the diode, the efficiency increase can be up to 20 percent compared to a light-emitting diode of the same structure with a scattering body made of a low-refractive silicone. Thus, at the scattering centers made of high-refractive silicone, there is no or only a slight absorption of the electromagnetic primary radiation in the blue range.

The light-emitting diode may comprise several layer sequences, for example, more than two layer sequences. For example, the individual layer sequences can emit primary radiation in the red, green and blue regions of the electromagnetic spectrum that superimpose a white luminous impression. Altogether, white light can be emitted from the light-emitting diode to the outside environment. In particular, with this example, a scattering of the primary radiation is necessary to guarantee homogeneity of the coupled-out white mixed light.

It is also possible that all layer sequences emit a blue primary radiation. To produce white light, converter particles can be arranged in the beam path of the primary radiation that convert the primary radiation into secondary radiation, for example, in the green and red spectral range.

The scattering body may be formed as a layer, as a potting and/or as a housing.

The scattering body may be applied as a layer, in particular as a mirror layer, on one side of the at least one layer sequence facing away from the growth substrate. In particular, the incident primary radiation is reflected back into the layer sequence and can thus be radiated from the main surface of the layer sequence opposite the mirror layer.

The light-emitting diode may comprise a carrier on which the at least one layer sequence is applied. Between the carrier and the layer sequence, the scattering body can be arranged in the form of a layer or mirror layer. It is also possible that the scattering body formed as a mirror layer is applied to the side surfaces of the layer sequence.

The light-emitting diode may comprise a housing. A recess may be provided in the center of the housing. The at least one layer sequence can be located in the recess of the housing. It is also possible that the recess is filled with a potting covering the layer sequence. However, the recess can also consist of an air space.

The housing may comprise or consist of the silicone composition. It is possible that the entire housing contains or consists of the silicone composition.

The surface of the housing may be completely or partially coated in the region of the recess with a layer comprising or consisting of the silicone composition.

The scattering body in the form of a layer can be mounted directly on the layer sequence in one example. It is possible that the layer covers the entire surface of the layer sequence.

The scattering body, which is in the form of a layer, may be arranged above the recess in the housing. In this example of the scattering body, there is no direct and/or form-fit contact between the scattering body and the at least one layer sequence. This is to say that there can be a distance between the scattering body and the layer sequence. In other words, the scattering body is arranged downstream of the layer sequence and illuminated by the primary radiation. A potting or an air gap can then be formed between the scattering body and the layer sequence.

The light-emitting diode may comprise a potting. The potting preferably completely covers the at least one layer sequence.

The scattering body may contain filler particles. The filler particles can be, for example, reflector particles and/or converter particles. It is also possible, for example, that several different types of fillers are simultaneously embedded in the silicone composition.

For example, titanium dioxide or silicon dioxide particles can be used as reflector particles. This makes it possible to select a lower mass fraction of high-refractive silicone in the silicone composition, which, however, results in only slight losses of the optical properties, in particular the luminous efficacy, since the proportion of reflector particles is kept low. In particular, the proportion of reflector particles may be less than one mass percentage in relation to the total mass of the scattering body. The proportion of scattering particles in conventional scattering bodies is usually less than two percent by mass. Alternatively, the light scattering and/or reflection can be further improved by adding the reflector particles for a given mass proportion of high-refractive silicone in the silicone composition.

The converter particles convert the primary electromagnetic radiation partially or completely into secondary electromagnetic radiation. That the primary electromagnetic radiation is partially converted into secondary electromagnetic radiation means that the primary electromagnetic radiation is at least partially absorbed by the converter particles and emitted as secondary radiation with a wavelength range at least partially different from the primary radiation. Primary and secondary electromagnetic radiation may comprise one or more wavelengths and/or wavelength ranges in an infrared to ultraviolet wavelength range, in particular in a visible wavelength range. For example, primary electromagnetic radiation may have a wavelength range from an ultraviolet to green wavelength range, while secondary electromagnetic radiation may have a wavelength range from a blue to infrared wavelength range. Particularly preferably, primary radiation and secondary radiation superimposed on each other can create a white luminous impression. For this purpose, the primary radiation can preferably create a blue-colored luminous impression and the secondary radiation a yellow-colored luminous impression, which can be created by spectral components of the secondary radiation in the yellow-wavelength range and/or spectral components in the green and red wavelength ranges.

That the converter particles completely convert the primary electromagnetic radiation into secondary electromagnetic radiation means that the primary electromagnetic radiation is completely or almost completely absorbed by the converter particles and emitted in the form of secondary electromagnetic radiation. The emitted radiation of the optoelectronic component according to this example corresponds completely or almost completely to the electromagnetic secondary radiation. Almost complete conversion means a conversion of more than 90%, in particular more than 95%.

The converter particles can, for example, be formed from one of the following phosphors: garnets doped with rare earth metals, alkaline earth sulphides doped with rare earth metals, thiogallates doped with rare earth metals, aluminates doped with rare earth metals, silicates doped with rare earth metals such as orthosilicates, chlorosilicates doped with rare earth metals, alkaline earth silicon nitrides doped with rare earth metals, oxinitrides doped with rare earth metals and aluminium oxinitrides doped with rare earth metals, silicon nitrides doped with rare earth metals, sialones.

In particular, garnets such as yttrium alumina (YAG), lutetium alumina (LuAG) and terbium alumina (TAG) can be used as phosphors.

The phosphors, for example, are doped with one of the following activators: cerium, europium, terbium, praseodymium, samarium, manganese.

The scattering body may comprise converter particles of different phosphors.

The scattering body may consist of the silicone composition and converter particles.

Further advantages and developments result from the examples described in the following in connection with the Figures.

In the examples and Figures, identical or identical acting components are each provided with the same reference signs. The elements shown and their proportions are not to be regarded as true to scale, rather individual elements, in particular layer thicknesses, may be shown exaggeratedly large for better understanding.

The light-emitting diode 1 shown in FIG. 1 shows a carrier 5 with a lead frame 6. A layer sequence 2 is arranged on the carrier 5 electrically connected to the lead frame 6 via bonding wires 7. A scattering body 3 in the form of a layer is applied above the layer sequence 2. The scattering body 3 comprises a silicone composition comprising a multiphase mixture of a low-refractive silicone having a refractive index $n^{25}_{D589}$ of 1.40 to 1.41 and a high-refractive silicone having a refractive index $n^{25}_{D589}$ of 1.51. KJR90xx and LPS55xx of ShinEtsu Chemical, for example, can be used as precursors of the low-refractive silicone and the first curing agent and as precursors of the high-refractive silicone and the second curing agent. The proportion of high-refractive silicone is 0.5 to 2.0 mass percent in relation to the total mass of high-refractive and low-refractive silicone. The high-refractive silicone forms droplet structures or inclusions within the low-refractive silicone. These inclusions serve as scattering centers, in which the primary radiation emitted by the active layer of the layer sequence 2 is refracted or totally reflected and thus scattered. Primary radiation is not or only slightly absorbed by the silicone composition.

The primary radiation is coupled out upwards via a transparent layer sequence 2 and the scattering body 3.

Figure 2:
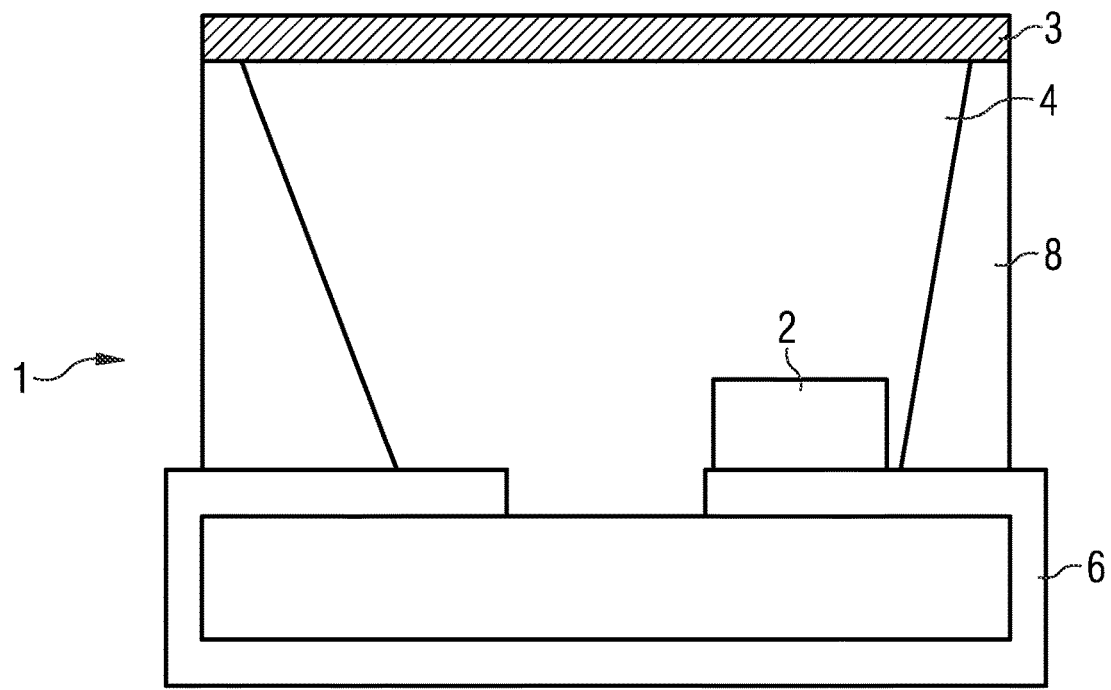

The light-emitting diode 1 as shown in FIG. 2 shows a housing 8 with a lead frame 6. The housing 8 has a recess in the center, in which the layer sequence 2 is arranged, which electrically conductively connects to the lead frame 6. The recess is filled with a potting 4. The potting 4, for example, comprises a low-refractive silicone.

A scattering body 3 is arranged above the recess of the housing 8 and the housing 8. The scattering body 3 is formed in the form of a layer and arranged in the beam path of the electromagnetic primary radiation emitted by an active layer (not shown here separately) in the layer sequence 2.

The scattering body 3 comprises or consists of a multiphase mixture of a low-refractive silicone having a refractive index $n^{25}_{D589}$ of 1.40 or 1.41 and a high-refractive silicone having a refractive index $n^{25}_{D589}$ of 1.51. The proportion of high-refractive silicone is 0.5 to 2.0 mass percent with respect to the total mass of high-refractive and low-refractive silicone. The low-refractive silicone of the silicone composition of the scattering body 3 and the potting 4 may be identical.

Figure 3:
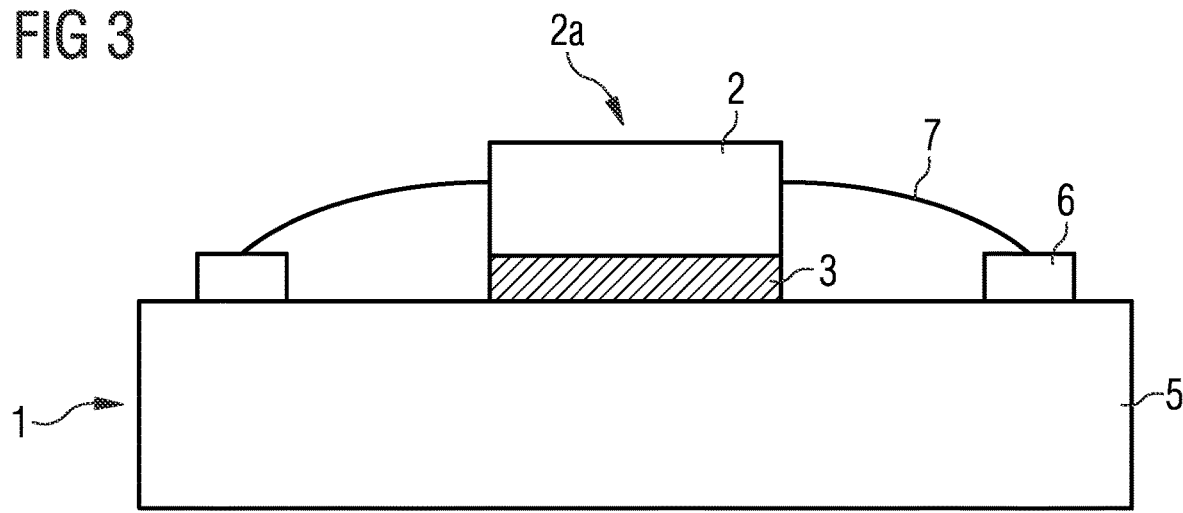

In the light-emitting diode 1 according to FIG. 3, the scattering body 3 is arranged between the carrier 5 and the layer sequence 2 compared to the light-emitting diode 1 of FIG. 1. The layer sequence 2 is a volume-emitting layer sequence 2, i.e., the primary radiation is radiated over all surfaces of layer sequence 2. The primary radiation is reflected back into the layer sequence 2 by the scattering body 3 and can thus be emitted over the main surface 2a of the layer sequence 2 opposite the scattering body. In addition, the scattering body 3 can be applied to the side surfaces of the layer sequence 2 (not shown here).

Figure 4:
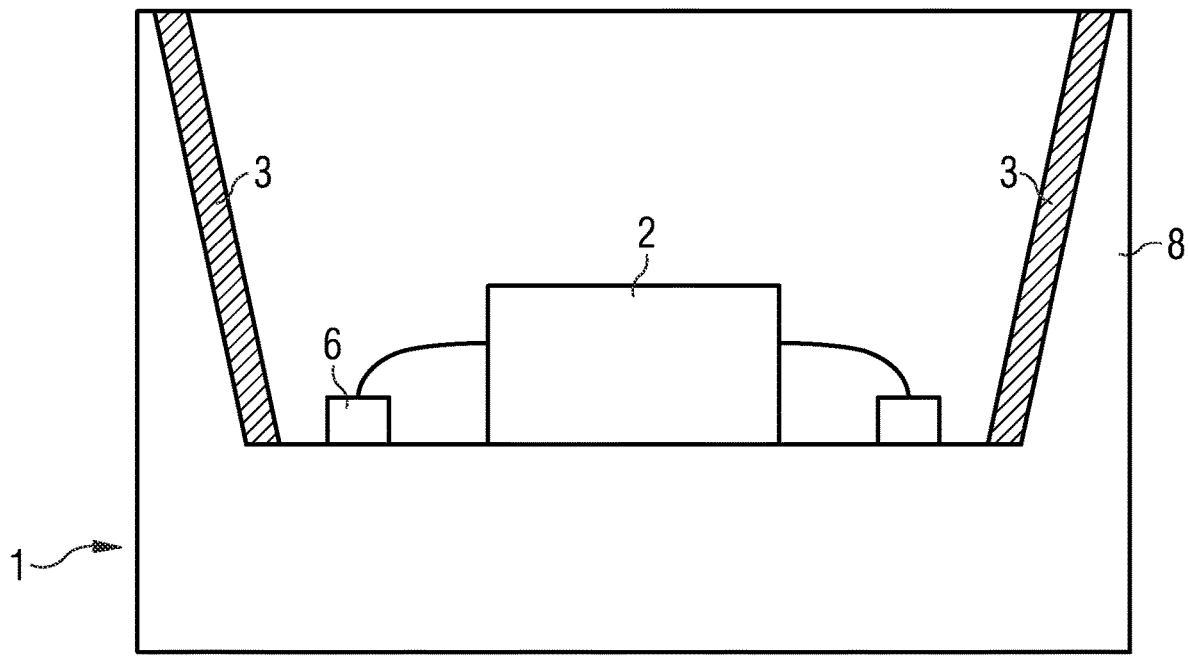

The light-emitting diode 1 as shown in FIG. 4 shows a housing 8 with a lead frame 6. A layer sequence 2 is arranged in the recess of the housing 8, which electrically connects to the lead frame 6 via bonding wires 7. The surface of the housing 8 has in the region of the recess in whole or in part a scattering body 3 formed as a layer. The scattering body 3 comprises or consists of a silicone composition comprising or consisting of a multiphase mixture of a low-refractive silicone having a refractive index $n^{25}_{D589}$ of 1.40 or 1.41 and a high-refractive silicone having a refractive index $n^{25}_{D589}$ of 1.51. The proportion of high-refractive silicone is 0.5 to 2.0 mass percent with respect to the total mass of high-refractive and low-refractive silicone. Alternatively, the housing 8 may consist entirely of or comprise the silicone composition to form the scattering body 3 (not shown).

FIGS. 5B, 6B, 7B and 8B each show a light-emitting diode 1 comprising 24 sapphire semiconductor chips 2 arranged on a mirrored metal plate and wired by bonding wires with one another (not shown). A housing 8 made of silicone is arranged around the sapphire semiconductor chips 2. The cavity formed by the housing 8 is filled with a potting 4 thus arranged above the semiconductor chips 2. The sapphire semiconductor chips 2 emit primary radiation in the blue region of the electromagnetic spectrum. The sapphire semiconductor chips 2 are volume emitting.

In the light-emitting diode of FIG. 5B, the potting 4 consists of a low-refractive silicone with a refractive index of 1.40 to 1.41. The semiconductor chips 2 connect via bonding wires (not shown). During operation of the diode, the bonding wires are visible since the primary radiation emitted by the semiconductor chips 2, which is radiated to the outside by the potting 4, is not scattered. This can also be seen in the diagram in FIG. 5A in which the luminance L in cd/m2 is plotted against the spatially resolved length in µm. The diagram was made with the help of a luminance measuring camera and shows a section through the longest chip chain with six chips of FIG. 5B. The measurements were carried out at room temperature and an operating current of 200 mA. It can be seen from the diagram that the luminance over the respective chips has a maximum M, but drops to zero between the chips due to the lack of scattering of the primary radiation emitted by the semiconductor chips 2.

In comparison, the luminance measurement of the light-emitting diode 1 of FIGS. 6B, 7B and 8B between the semiconductor chips 2 shows a certain luminance (FIGS. 6A, 7A, 8A) that increases with increasing proportion of high-refractive silicone within the silicone composition. FIGS. 6A, 7A and 8A were created with the help of a luminance measuring camera and each show a section through the longest chip chain with six chips of the corresponding FIGS. 6B, 7B and 8B. The measurements were carried out at room temperature and an operating current of 200 mA. The potting 4 of diode 1 according to FIGS. 6B, 7B and 8B is formed as scattering body 3 and consists of a silicone composition consisting of a multiphase mixture of a low-refractive silicone having a refractive index $n^{25}_{D589}$ of 1.40 to 1.43 and a high-refractive silicone having a refractive index $n^{25}_{D589}$ of 1.51 to 1.54. The proportion of high-refractive silicone is 0.5 mass percent (FIG. 6B), 1.0 mass percent (FIG. 7B) and 2.0 mass percent (FIG. 8B) in relation to the total mass of high-refractive and low-refractive silicone. The high-refractive silicone forms droplet structures or inclusions within the low-refractive silicone. These inclusions serve as scattering centers in which the primary radiation emitted by the active layer of the semiconductor chips 2 is scattered. The bonding wires are not visible in the devices of FIGS. 6B, 7B and 8B during their operation due to the light scattering between the semiconductor chips 2. Surprisingly, despite the observed light scattering, an increase in efficiency can be achieved compared to the light-emitting diode 1 of FIG. 5B. The maximum increase in efficiency of 17% is achieved with a proportion of high-refractive silicone of 2.0 mass percent.

FIGS. 9 and 10 show the luminance L for individual light-emitting devices. The light-emitting diodes provided with the following reference signs are to be associated with the following light-emitting diodes:

R1: light-emitting diodes 1 of FIG. 5B (Reference)
Ia: light-emitting diodes from FIG. 6B with a proportion of high-refractive silicone of 0.5 mass percent in relation to the total mass of high-refractive and low-refractive silicone.
IIa: light-emitting diodes of FIG. 6B with a proportion of high-refractive silicone of 1.0 mass percent in relation to the total mass of high-refractive and low-refractive silicone.
IIIa: light-emitting diodes of FIG. 6B with a proportion of high-refractive silicone of 2.0 mass percent in relation to the total mass of high-refractive and low-refractive silicone.
R2: light-emitting diodes of FIG. 5B, wherein the potting additionally comprises 4 converter particles, which partially convert the blue primary radiation into a secondary radiation in the green and red spectral range. Altogether, the light-emitting diodes emit white light. (Reference)
Ib: light-emitting diodes of FIG. 6B containing 0.5 mass percent of high-refractive and low-refractive silicone in relation to the total mass of high-refractive and low-refractive silicone. The scattering body 3 also contains converter particles that partially convert the blue primary radiation into secondary radiation in the green and red spectral range. Altogether, the light-emitting diodes emit white light.
IIb: light-emitting diodes of FIG. 6B with a proportion of high-refractive silicone of 1.0 mass percent in relation to the total mass of high-refractive and low-refractive silicone. The scattering body 3 also contains converter particles that partially convert the blue primary radiation into secondary radiation in the green and red spectral range. Altogether, the light-emitting diodes emit white light.
IIIb: light-emitting diodes of FIG. 6B with a proportion of high-refractive silicone of 2.0 mass percent in relation to the total mass of high-refractive and low-refractive silicone. The scattering body 3 also contains converter particles that partially convert the blue primary radiation into secondary radiation in the green and red spectral range. Altogether, the light-emitting diodes emit white light.

FIG. 9 shows a maximum efficiency increase of 17% of the light-emitting diodes with the reference signs IIIa with a mass fraction of 2.0% of high-refractive silicone within the silicone composition compared to reference R1.

FIG. 10 shows a maximum efficiency increase of 5% of the light-emitting diodes with the reference signs Ib with a mass fraction of 0.5% of high-refractive silicone within the silicone composition compared to reference R2.

Figure 11:
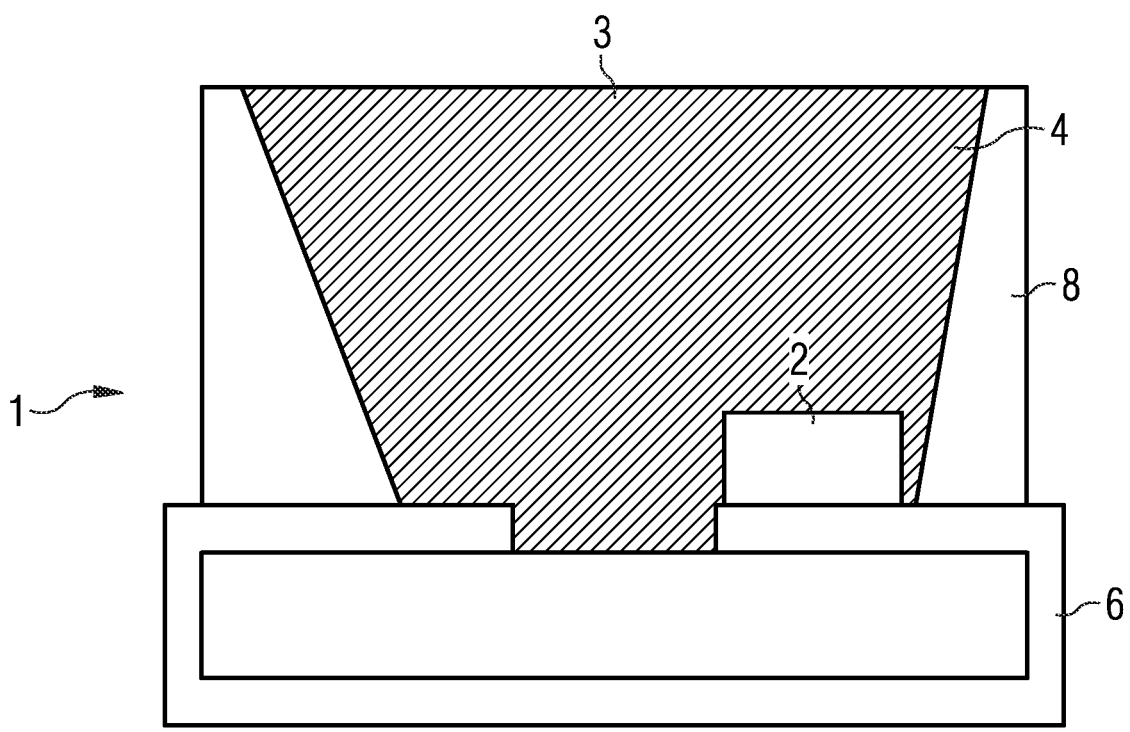

The light-emitting diode 1 as shown in FIG. 11 shows housing 8 with a lead frame 6. The housing 8 has a recess in the center in which the layer sequence 2 is arranged, which electrically conductively connects to the lead frame 6. The recess is filled with a scattering body 3 in the form of a potting 4. The scattering body 3 comprises or consists of a multiphase mixture of a low-refractive silicone having a refractive index $n^{25}_{D589}$ of 1.40 or 1.41 and a high-refractive silicone having a refractive index $n^{25}_{D589}$ of 1.50. The proportion of high-refractive silicone is 0.5 to 2.0 mass percent with respect to the total mass of high-refractive and low-refractive silicone.

Our silicone compositions are not limited by the description of the examples. Rather, this disclosure includes any new feature and any combination of features, which in particular includes any combination of features in the appended claims, even if the feature or combination itself is not explicitly mentioned in the claims or examples.

This application claims priority of DE 10 2016 114 921.7, the subject matter of which is incorporated herein by reference.

The invention claimed is:

1. A silicone composition comprising a multiphase mixture of a low-refractive silicone having a refractive index $n^{25}_{D589}$ less than 1.45 and a high-refractive silicone having a refractive index $n^{25}_{D589}$ greater than 1.50, wherein a proportion of high-refractive silicone is 0.1 to 5.0 mass percent in relation to a total mass of high-refractive and low-refractive silicone, the high-refractive silicone forms inclusions within the low-refractive silicone, the silicone composition is free of converter particles, the silicone composition comprises reflector particles, and a proportion of the reflector particles is less than 1 mass percent in relation to the total mass of high-refractive, low-refractive silicone and reflector particles.

2. The silicone composition according to claim 1, wherein the high-refractive silicone is homogeneously distributed in the low-refractive silicone.

3. A scattering body comprising the silicone composition according to claim 1 that scatters and/or reflects light.

4. The scattering body according to claim 3, which is part of a light-emitting device.

5. A method of producing the silicone composition according to claim 1 comprising:

A) mixing a precursor of a low-refractive silicone with a first curing agent,
B) mixing a precursor of a high-refractive silicone with a second curing agent,
C) mixing the mixtures produced in method steps A) and B) to form an emulsion, and
D) curing the emulsion formed in method step C) to form the silicone composition.

6. A light-emitting device comprising a scattering body comprising the silicone composition according to claim 1 or consisting of the silicone composition.

7. The light-emitting device according to claim 6, wherein the scattering body is arranged on a light-emitting surface of the light-emitting device.

8. The light-emitting device according to claim 6 formed as a light-emitting diode comprising at least one layer sequence having an active layer emitting an electromagnetic primary radiation, wherein the scattering body is arranged in the beam path of the electromagnetic primary radiation.

9. The light-emitting device according to claim 6, wherein the scattering body is formed as a layer, a potting and/or a housing.

10. A light-emitting diode comprising a scattering body comprising the silicone composition according to claim 1 or consisting of the silicone composition.

* * * * *